United States Patent
Lam et al.

(10) Patent No.: US 9,099,116 B2
(45) Date of Patent: Aug. 4, 2015

(54) STIFF DISCRETE INSERT ARRAY FOR THERMAL PTR MANAGEMENT WITH DESIRED INDUCED STRESS STATE THAT REDUCES TENDENCY FOR WRITE POLE ERASURE

(71) Applicant: HGST Netherlands B.V., Amsterdam (NL)

(72) Inventors: Quan-Chiu Harry Lam, San Jose, CA (US); Edward Hin Pong Lee, San Jose, CA (US); Xinjiang Shen, Fremont, CA (US); Ning Shi, San Jose, CA (US)

(73) Assignee: HGST NETHERLANDS, B.V., Amsterdam (NL)

( * ) Notice: Subject to any disclaimer, the term of this patent is extended or adjusted under 35 U.S.C. 154(b) by 0 days.

(21) Appl. No.: 14/012,310

(22) Filed: Aug. 28, 2013

(65) Prior Publication Data

US 2015/0062753 A1 Mar. 5, 2015

(51) Int. Cl.
*G11B 5/31* (2006.01)

(52) U.S. Cl.
CPC ............ *G11B 5/3163* (2013.01); *G11B 5/3116* (2013.01); *G11B 5/3136* (2013.01)

(58) Field of Classification Search
CPC ...... G11B 5/3133; G11B 5/3136; G11B 5/40; G11B 5/3116; G11B 5/3163
USPC .............. 360/125.3, 125.31, 125.32, 125.74, 360/125.75
See application file for complete search history.

(56) References Cited

U.S. PATENT DOCUMENTS

| | | | |
|---|---|---|---|
| 7,035,046 B1* | 4/2006 | Young et al. | 360/125.75 |
| 7,092,208 B2* | 8/2006 | Zou et al. | 360/128 |
| 7,102,853 B2 | 9/2006 | Macken et al. | |
| 7,199,974 B1* | 4/2007 | Alfoqaha | 360/123.09 |
| 7,542,246 B1 | 6/2009 | Song et al. | |
| 7,576,950 B2 | 8/2009 | Matono | |
| 7,593,183 B2 | 9/2009 | Hsiao et al. | |
| 7,688,544 B1 | 3/2010 | Mallary et al. | |
| 7,770,285 B2 | 8/2010 | Bonhote et al. | |
| 8,102,625 B2* | 1/2012 | Shiramatsu et al. | 360/125.74 |
| 8,264,792 B2* | 9/2012 | Bai et al. | 360/125.15 |
| 8,593,763 B2* | 11/2013 | Scheppers et al. | 360/235.7 |
| 2005/0225897 A1* | 10/2005 | Liu et al. | 360/126 |
| 2009/0059432 A1* | 3/2009 | Kubotera et al. | 360/236.6 |
| 2010/0073815 A1* | 3/2010 | Aoki et al. | 360/110 |
| 2010/0118439 A1* | 5/2010 | Aoki | 360/125.01 |
| 2010/0238592 A1* | 9/2010 | Mizutani | 360/235.4 |
| 2011/0116192 A1 | 5/2011 | Fujita et al. | |
| 2011/0133063 A1* | 6/2011 | Ji et al. | 250/227.24 |
| 2012/0057257 A1 | 3/2012 | Takano et al. | |
| 2012/0087042 A1 | 4/2012 | Zhou et al. | |
| 2013/0010386 A1 | 1/2013 | Meloche et al. | |

OTHER PUBLICATIONS

Patwari; Micromagnetic Tests of Techniques for Reducing Pole Tip Remanence of High Density Perpendicular Write Heads;: University of Minnesota Dissertation; Sep. 2010, 149 pages.
Maeda et al.; "Writer Pole Head Remanence of a Tapered Main Pole Head"; Journal of Applied Physics; Feb. 2010, 4 pages.

* cited by examiner

*Primary Examiner* — Angel Castro
(74) *Attorney, Agent, or Firm* — Patterson & Sheridan, LLP

(57) ABSTRACT

Embodiments of the present invention generally relate to a magnetic device having a discontinuous array of columns disposed near a magnetic pole. Each column has a length extending perpendicular to an air bearing surface and a width. The length is greater than the width.

5 Claims, 7 Drawing Sheets

STIFF DISCRETE INSERT ARRAY FOR THERMAL PTR MANAGEMENT WITH DESIRED INDUCED STRESS STATE THAT REDUCES TENDENCY FOR WRITE POLE ERASURE

BACKGROUND

1. Field

Embodiments of the present invention generally relate to magnetic data recording, and more particularly to a structure for preventing pole erasure and thermally induced pole tip deformation in a write head.

2. Description of the Related Art

The heart of a computer is a magnetic disk drive which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider towards the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing, the write and read heads are employed for writing magnetic impressions to and reading magnetic signal fields from the rotating disk. The read and write heads are connected to processing circuitry that operates according to a computer program to implement the writing and reading functions.

Most recently researchers have focused on the development of perpendicular magnetic recording (PMR) systems in order to increase the data density of a recording system. Such perpendicular recording systems record magnetic bits of data in a direction that is perpendicular to the surface of the magnetic medium. A write head used in such a system generally includes a write pole having a relatively small cross section at the ABS and a return pole having a larger cross section at the ABS. A magnetic write coil induces a magnetic flux to be emitted from the write pole in a direction generally perpendicular to the plane of the magnetic medium. This flux returns to the write head at the return pole where the flux is sufficiently spread out and weak that the flux does not erase the signal written by the write pole.

In order to meet ever increasing demand for improved data rate and data capacity, researchers are constantly seeking ways to make read and write heads smaller while increasing the write field produced by such write heads. Increasing the overwrite field requires increasing the current flow through the write coil. Decreasing the size of the write head requires decreasing the size of the write coil (decreasing the cross sectional area of the turns of the coil), which increases the electrical resistance of the coil.

This decrease in size and increase in write current greatly increases the amount of heat generated by the write head during use. This heat causes unwanted thermal expansion of the write head, which can result in catastrophic deformation of the write head structure. This deformation is especially problematic in current and future magnetic heads, where the fly height of the head is exceedingly small, on the order of nanometers. The thermal protrusion of the write head, combined with these low fly heights can result in catastrophic head disk contact during use. To reduce the thermal protrusion of the write head, a stiff plate with low coefficient of thermal expansion (CTE) has been used to provide constraint for thermal pole tip protrusion (PTR). However, such method fundamentally utilizes stress transfer from the stiff insert to the rest of the head. As such, the generation of stresses may also affect the main pole magnetic properties due to relative large positive magnetostriction effect of CoFe alloys currently being used. The stresses generated may favor a magnetization state such that its orientation may align unfavorably causing high remanence and unintended pole erasure by the write head. Therefore, an improved magnetic device having a reduced tendency for write pole erasure is needed when managing PTR through stress transfer.

SUMMARY OF THE INVENTION

The embodiments of the present invention generally relate to a magnetic device having a discontinuous array of columns disposed near a magnetic pole. Each column has a length extending perpendicular to an air bearing surface and a width. The length is greater than the width.

In one embodiment, a magnetic head is disclosed. The magnetic head includes a write pole extending to an air bearing surface and a discontinuous array of columns aligned in a cross-track direction and disposed over the write pole. Each column has a length extending perpendicular to the air bearing surface and a width. The length is greater than the width.

In another embodiment, a magnetic head is disclosed. The magnetic head includes a discontinuous array of columns, a dielectric material disposed between and over the discontinuous array of columns, a read head disposed over the dielectric material, and a write head disposed over the read head.

In another embodiment, a method for forming a magnetic head is disclosed. The method includes depositing and forming a write pole over a substrate, encapsulating the write pole with insulating dielectric material such as alumina, and depositing and forming an insert layer over the write pole, removing portions of the insert layer to form a discontinuous array of columns by liftoff or by masking-and-etch, and depositing a fill material between the discontinuous array of columns.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The embodiments of the present invention generally relate to a magnetic device having a discontinuous array of columns disposed adjacent to a magnetic pole. Each column has a length extending at an angle to the ABS surface preferably perpendicular to the ABS and the cross section area of these discrete columns parallel to the ABS is much smaller than the total surface area of the column. Another way of describing such geometry is that the aspect ratio of length vs. width or thickness of the columns is much greater than one.

Figure 1:
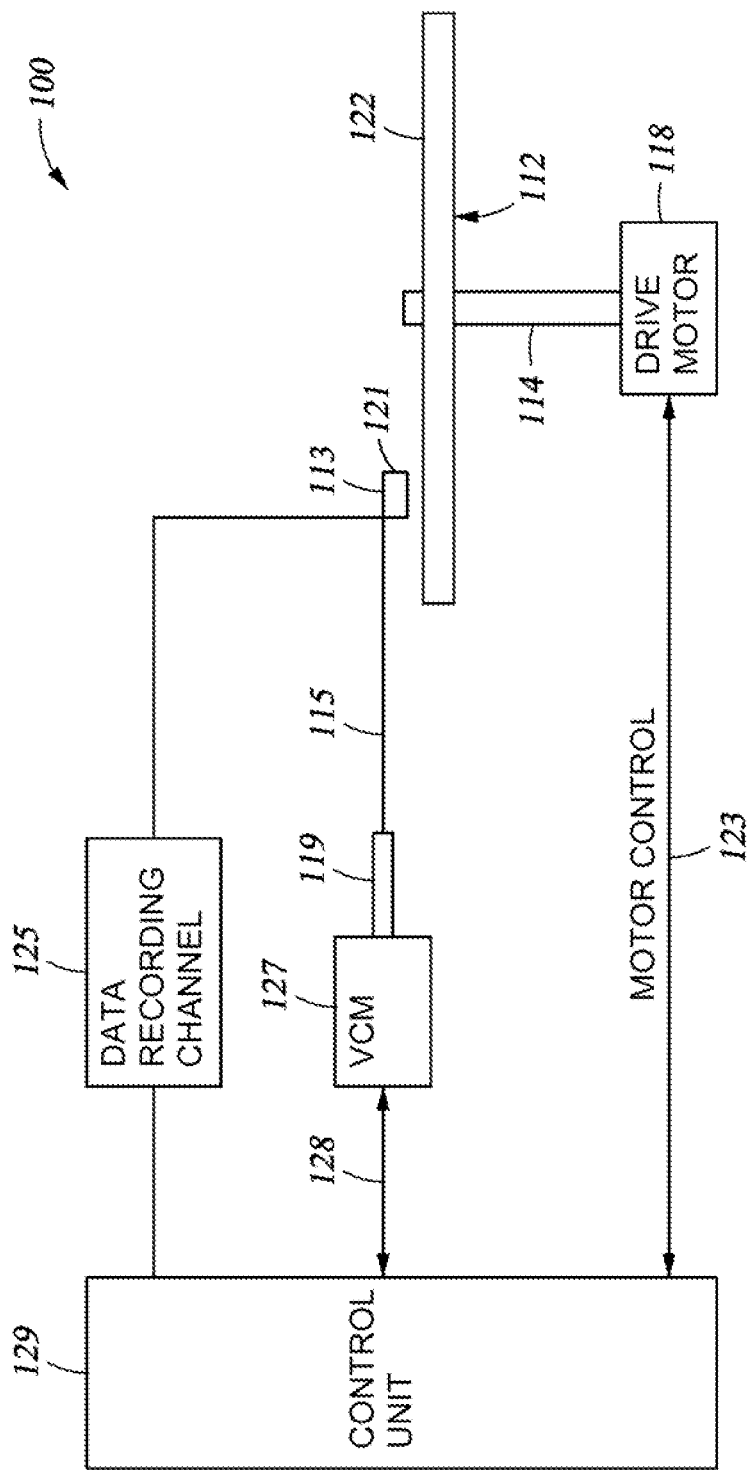
FIG. 1 illustrates a disk drive system, according to an embodiment of the invention.

FIG. 1 illustrates a disk drive 100 embodying this invention. As shown, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, the slider 113 moves radially in and out over the disk surface 122 so that the magnetic head assembly 121 may access different tracks of the magnetic disk 112 where desired data is written. Each slider 113 is attached to an actuator arm 119 by way of a suspension 115. The suspension 115 provides a slight spring force which biases the slider 113 towards the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by control unit 129.

During operation, the rotation of the magnetic disk 112 generates an air bearing between the slider 113 and the disk surface 122 which exerts an upward force or lift on the slider 113. The air bearing thus counter-balances the slight spring force of suspension 115 and supports slider 113 slightly above the disk 112 surface by a small, substantially constant spacing during normal operation.

The various components of the disk drive 100 are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads on the assembly 121 by way of recording channel 125.

The above description of a typical magnetic disk storage system and the accompanying illustration of FIG. 1 are for representation purposes only. It should be apparent that disk storage systems may contain a large number of disks and actuators, and each actuator may support a number of sliders.

Figure 2A:
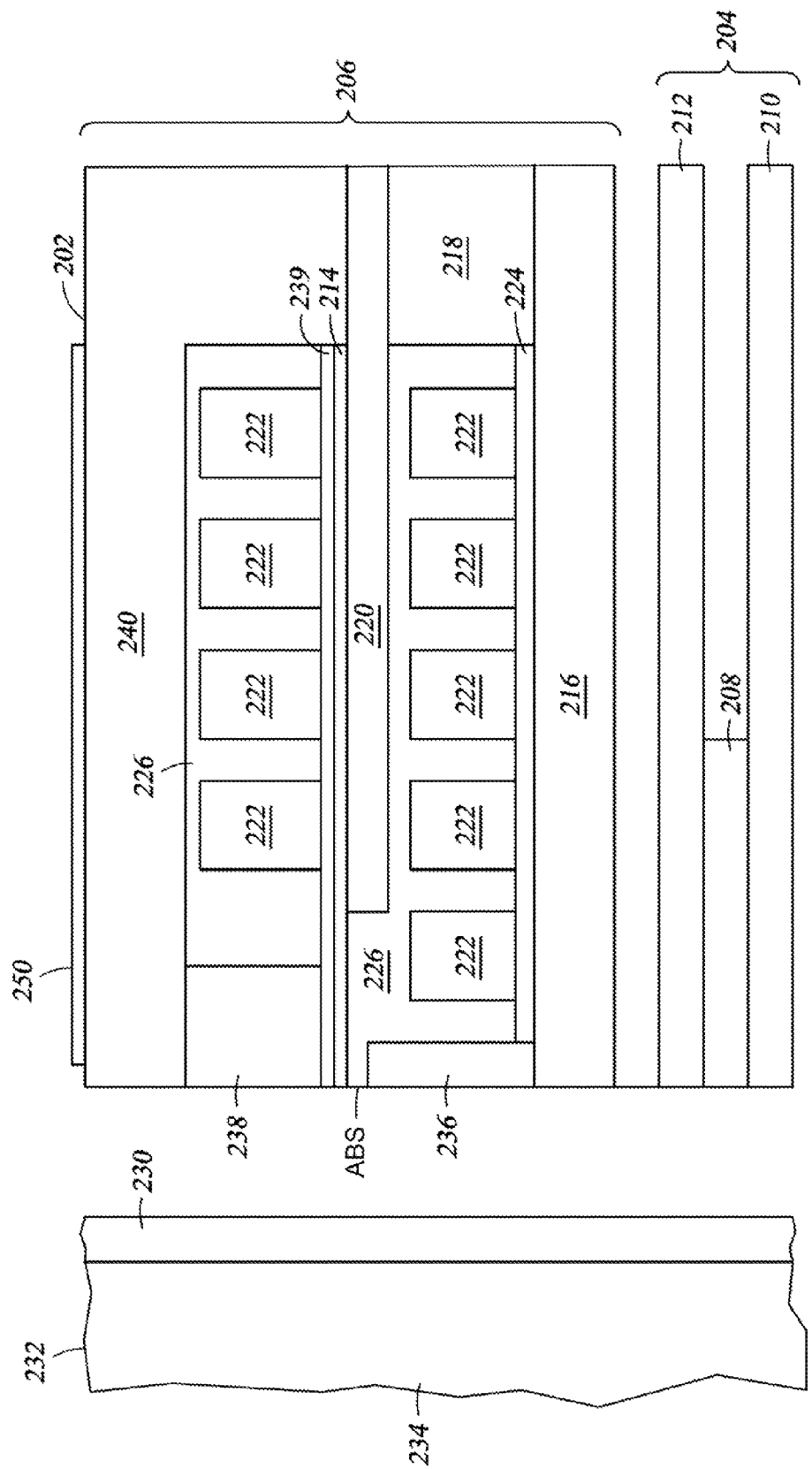
FIGS. 2A-2B illustrate a side view of a magnetic device according to embodiments of the invention.

FIG. 2A illustrates a side view of a magnetic head 202 according to one embodiment of the invention. The magnetic head 202 includes a read head 204 and a write head 206. The read head 204 includes a magnetoresistive sensor 208, which can be a giant magnetoresistance (GMR), tunnel magnetoresistive (TMR), or some other type of sensor. The magnetoresistive sensor 208 is located between first and second magnetic shields 210, 212.

The write head 206 includes a magnetic write pole 214 and a magnetic return pole 216. The write pole 214 can be formed upon a magnetic shaping layer 220, and a magnetic back gap layer 218 magnetically connect the write pole 214 and the shaping layer 220 with the return pole 216 at a location removed from the ABS. A write coil 222 (shown in cross section in FIG. 2A) passes between the write pole 214, the shaping layer 220, and the return pole 216, and may also pass above the write pole 214 and the shaping layer 220. The write coil 222 can be a helical coil or can be one or more pancake coils. The write coil 222 can be formed upon an insulation layer 224 and can be embedded in a coil insulation layer 226 such as alumina and or hard baked photoresist.

During operation, an electrical current flowing through the write coil 222 induces a magnetic field that causes a magnetic flux to flow through the return pole 216, back gap layer 218, shaping layer 220, and write pole 214. This causes a magnetic write field to be emitted from the tip of the write pole 214 toward a magnetic medium 232. The write pole 214 has a cross section at the ABS that is much smaller than the cross section of the return pole 216 at the ABS. Therefore, the magnetic field emitting from the write pole 214 is sufficiently dense and strong that the write pole 214 can write a data bit to a magnetically hard top layer 230 of the magnetic medium 232. The magnetic flux then flows through a magnetically soft underlayer 234, and returns back to the return pole 216, where the magnetic flux is sufficiently spread out and too weak to erase the data bit recorded by the write pole 214. A magnetic pedestal 236 may be provided at the ABS and attached to the return pole 216 to prevent stray magnetic fields from the write coil 222 from affecting the magnetic signal recorded to the magnetic medium 232.

Figure 2B:
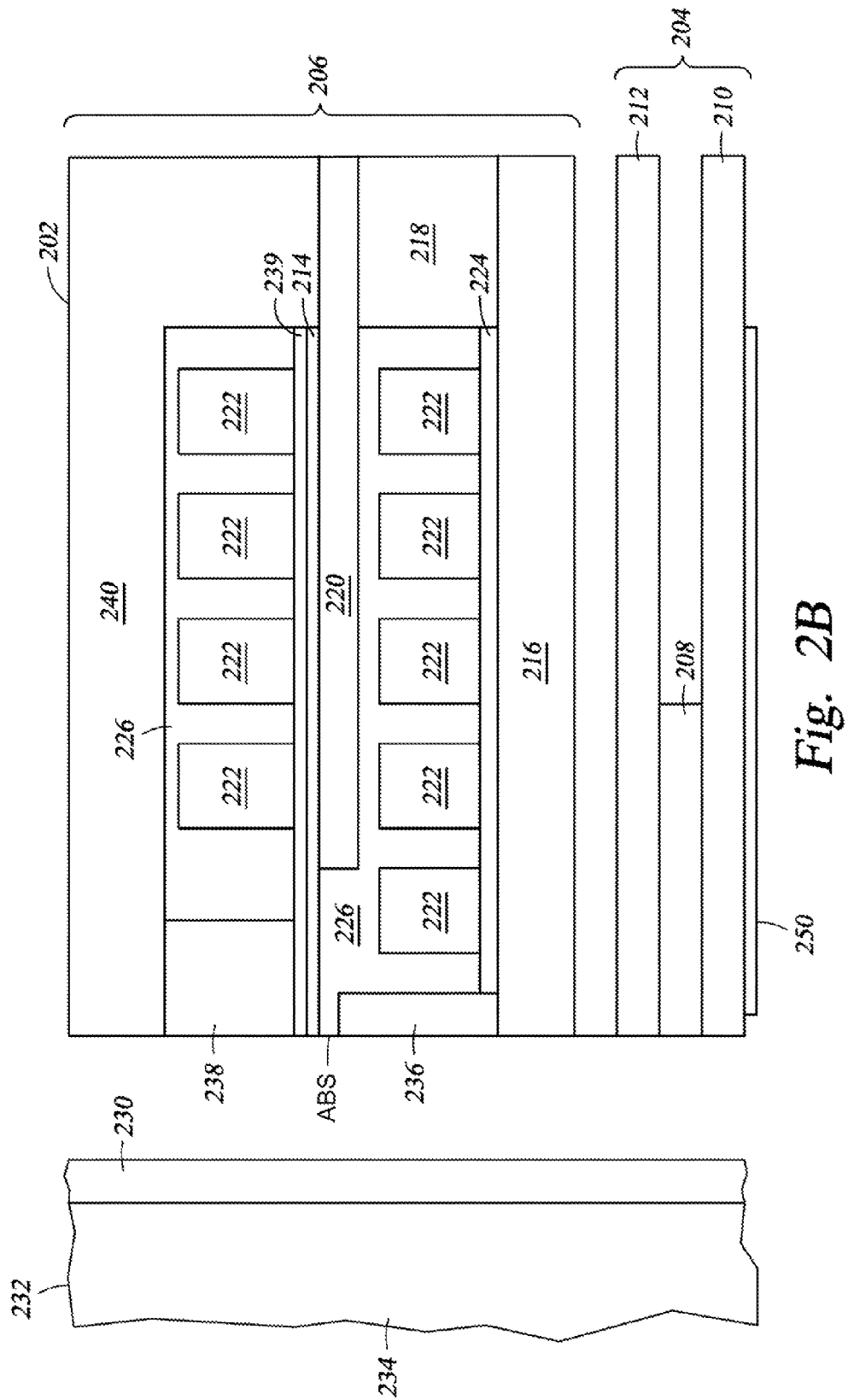

In order to increase write field gradient, and therefore increase the speed with which the write head 206 can write data, a trailing, wrap-around magnetic shield 238 may be provided. The magnetic shield 238 is separated from the write pole 214 by a non-magnetic layer 239. The magnetic shield 238 attracts the magnetic field from the write pole 214, which slightly cants the angle of the magnetic field emitting from the write pole 214. This canting of the magnetic field increases the speed with which magnetic field polarity can be switched by increasing the field gradient. A trailing magnetic return pole 240 can be provided and can be magnetically connected with the magnetic shield 238. Therefore, the trailing return pole 240 can magnetically connect the magnetic shield 238 with the back portion of the write pole 214, such as with the back end of the shaping layer 220 and with the back gap layer 218. The magnetic shield 238 is also a second return pole so that in addition to magnetic flux being conducted through the medium 232 to the return pole 216, the magnetic flux also flows through the medium 232 to the trailing return pole 240. Disposed on the trailing return pole 240 is a discontinuous array of columns 250 (sometimes referred to as prisms, described in detail below). The location of the discontinuous array of columns 250 is not limited to above the write pole 214. In one embodiment, the discontinuous array of columns 250 is disposed below the first magnetic shield 210, as shown in FIG. 2B.

Figure 3:
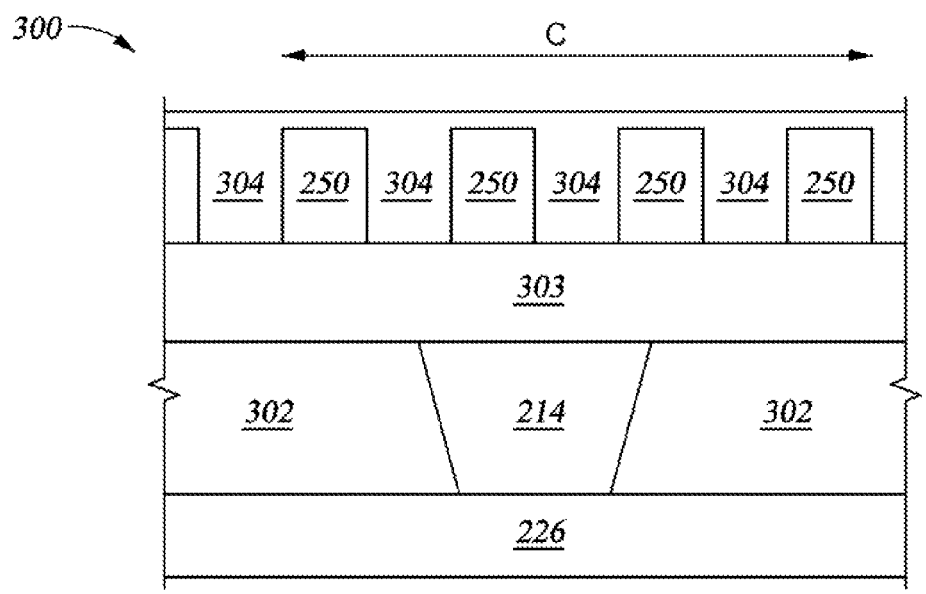
FIG. 3 is a cross sectional view of a magnetic head from an ABS according to one embodiment of the invention.

FIG. 3 is a cross sectional view of a magnetic head 300 from the ABS according to one embodiment of the invention. The write pole 214 is disposed over the insulating layer 226. An insulating material 302 is disposed adjacent the write pole 214. Over the write pole 214 and the insulating material 302 are write head structures 303 including the non-magnetic layer 239, the wrap-around shield 238, and the trailing return pole 240. These elements are not shown in FIG. 3 but are commonly known features in a PMR recording head. The elements are embedded in the dielectric fill material such as alumina ($Al_2O_3$). A thick layer of low CTE material such as silicon carbide (SiC) may be deposited over the write head structures 303. Such thick SiC insert may be photolithographically patterned such that a plurality of periodically repeating columns 250 is formed. The discrete SiC columns 250 may be formed by reactive ion etching (RIE). Another insulating material 304 is deposited between and over the columns 250. The distance between the columns 250 will be dictated by the ability to deposit the insulating material 304 into the opening between the columns 250 without voids and defects. The insulating layer 226 and the insulating materials 302, 304 may be $Al_2O_3$ and the columns 250 may be a stiff material having low CTE such as SiC, tungsten (W) or a combination thereof. Each column 250 has a rectangular or square cross section parallel to the ABS. These columns 250 may be recessed from the ABS for head disk material compatibilities. The sides of the rectangular or square cross section of each column 250, such as the width and the thickness of the cross section, are less than a length of the column 250 extending perpendicular to the ABS (into the paper). A parameter that describes such property is aspect ratio. The length to width or thickness aspect ratio of the columns 250 is much greater than 1. The larger the aspect ratio, the higher the anisotropy of the properties that are of interest, as described below. The columns 250 are aligned in a cross-track direction, indicated by arrows "C."

Figure 4:
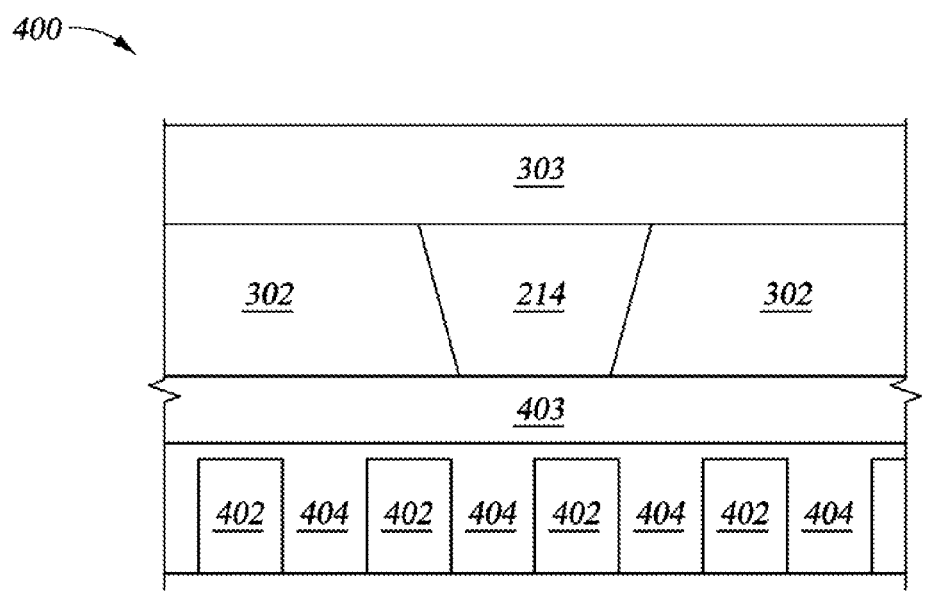
FIG. 4 is a cross sectional view of a magnetic head from the ABS according to one embodiment of the invention.

FIG. 3 illustrates the discontinuous array of columns 250 that is formed above the write pole 214 and the generalized write head structures 303 for stress generation purposes, as an example. However, the location of the columns 250 is generally near a heat source during recording (such as above coil 222 in FIG. 2A). Certain structures between the columns 250 and the write pole 214 shown in FIGS. 2A, 2B are omitted in FIG. 3 for ease of understanding of the main pole stress generation. FIG. 4 illustrates a magnetic head 400 having a discontinuous array of columns 402 disposed below the write pole 214. Again the fine structures in between the columns 402 and the write pole 214 are not shown in detail for ease of understanding the main pole stress generation.

As shown in FIG. 4, the write pole 214 is disposed between the write head structures 303 and elements 403. Elements 403 may include the insulating layer 226, the magnetic pedestal 236, the return pole 216 and the read head 204. Formed below the elements 403 is the discontinuous array of columns 402 which is embedded in a dielectric material 404. Again the fill material 404 may be $Al_2O_3$ and the columns 402 may be SiC or W. As described in FIG. 3, each column 402 has a rectangular or square cross section parallel to the ABS. The width and the thickness of the cross section are less than a length of the column 402 extending perpendicular to the ABS (into the paper). The way to make the embedded columns 402 and the dielectric material 404 without affecting the existing manufacturing process is, by commonly known processes, to pattern a blank insert film such as SiC and W and RIE the blank insert into desired shape as described, fill the gaps between the columns with dielectric insulation such as alumina and CMP the top surface flat. The read head and write head structures can then be built thereon.

Figure 5:
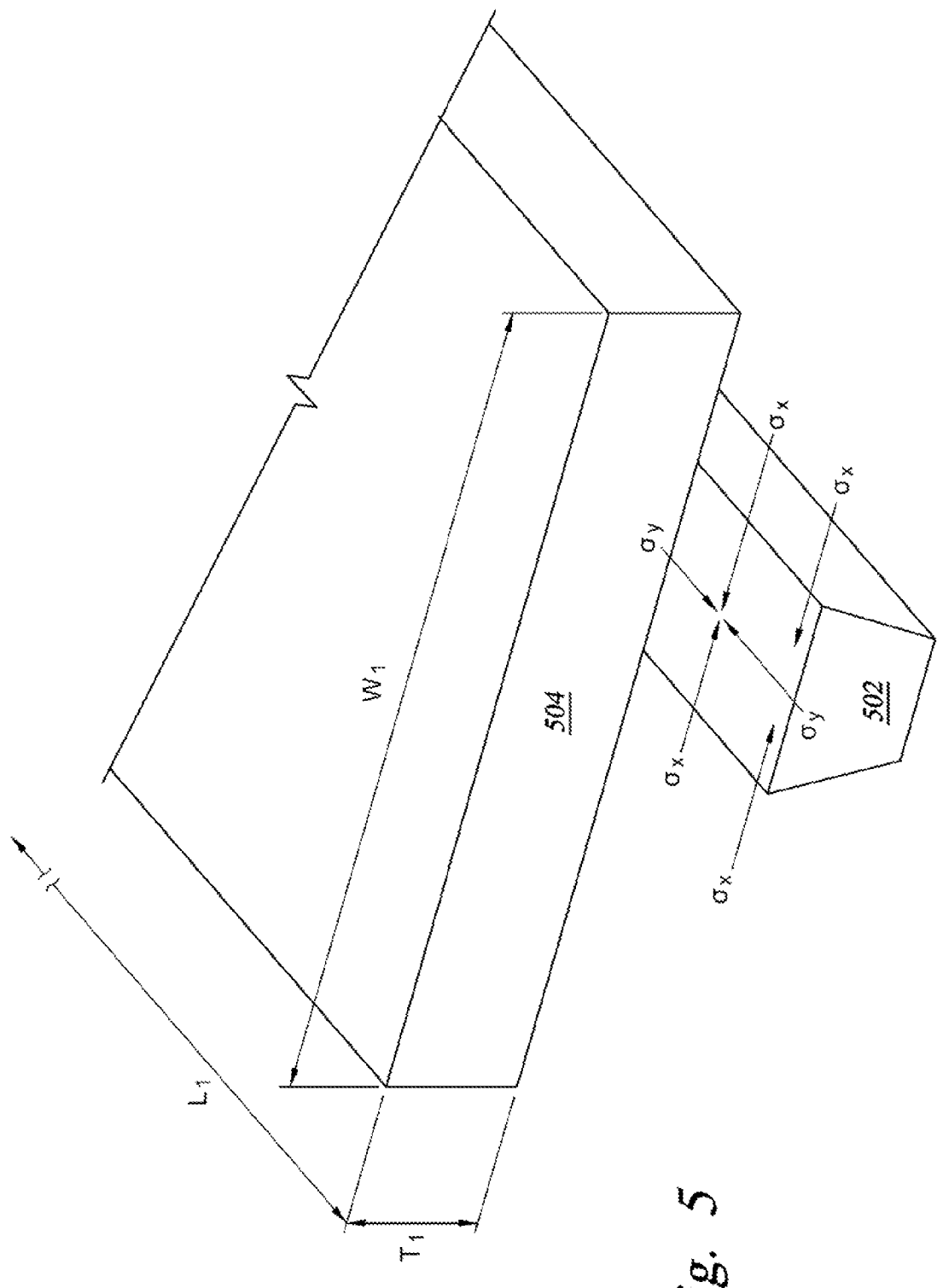
FIG. 5 shows a plate and a write pole of a conventional magnetic head.
Figure 6:
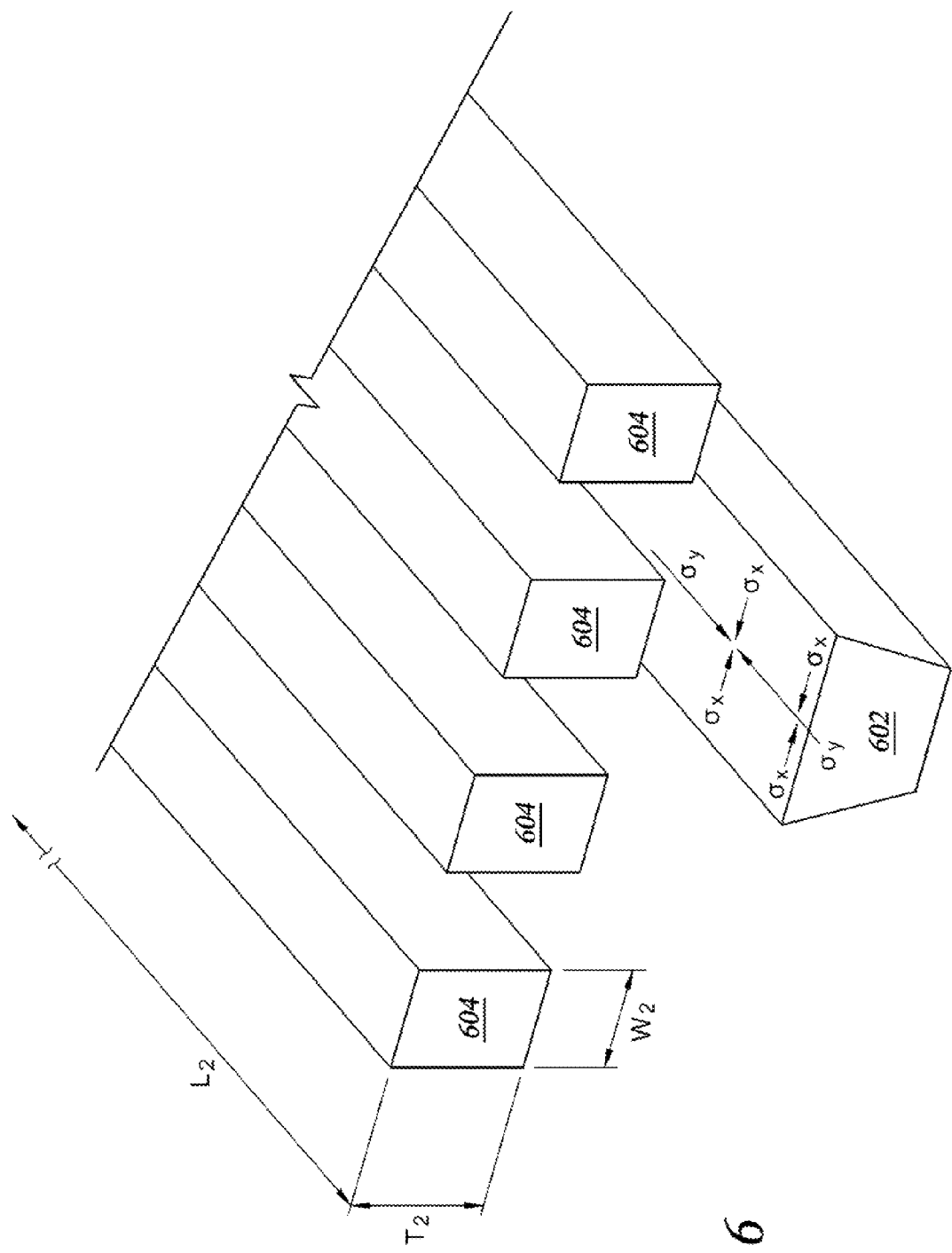
FIG. 6 shows a discontinuous array of columns and a write pole of a magnetic head according to embodiments of the invention.

The functions of the discontinuous array of columns 250 or 402 are conceptually illustrated in FIGS. 5 and 6. It is to be known that the actual head structure is much more complicated than what is shown in FIGS. 5 and 6. FIGS. 5 and 6 only show two relevant elements (the main pole in a simplified form and the discrete columns). The purpose of these diagrams is to highlight the concept, and the diagrams are an oversimplification for design purposes. For a more complete structure of a typical recording head, FIGS. 2A and 2B are to be referenced. FIG. 5 illustrates a write pole 502 and a conventional insert layer 504 (all other head features are omitted in the diagram to highlight physical interactions between the two elements). The write pole 502 may be the write pole 214. The conventional insert layer 504 is made of a stiff material in the form of a plate, which has a width ($W_1$), a thickness ($T_1$) and a length ($L_1$). The width is substantially greater than the thickness. The thickness and the width form a rectangle at the ABS and the length extends perpendicular to the ABS or substantially close to the ABS without exposing to the ABS. The conventional insert layer 504 induces a biaxial compressive stress in the write pole 502, indicated by arrows σx and σy, at a location away from the ABS. The stress σy helps to manage PTR. However, at the ABS, the conventional insert layer 504 exerts uniaxial σx, while the stress σy becomes zero because of the free surface at the ABS. The uniaxial compressive stress σx at the ABS increases the squareness of the magnetic (BH) loop, and in turn increases the tendency for pole erasure.

FIG. 6 shows a write pole 602 and a discontinuous array of columns 604. Again other elements such as insulating layers are omitted for better illustration. The write pole 602 may be the write pole 214. As shown in FIG. 6, a plurality of columns 604 are disposed spaced apart over the write pole 602. Each column 604 has a width ($W_2$), a thickness ($T_2$), and a length ($L_2$). The cross section of the columns 604 may be a square or a rectangle. The width $W_2$ is substantially smaller than the width $W_1$ and the length $L_2$ is substantially greater than the width $W_2$. The discontinuous array of columns 604 induces substantially smaller stress σx while the stress σy remains similar in magnitude. The compressive stress σy that helps to manage PTR does not change, while the stress σx induced by the columns 604 will be substantially reduced throughout the depth of the columns 604 compared to the stress σx induced by the continuous insert plate 504. This is due to the fact that the columns 604 are discontinuous and have a small dimension in the cross-track direction, leading to a minimal generation of compressive stress σx in the write pole 602. A smaller compressive stress exerted on the write pole 602 at the ABS reduces the tendency for pole erasure. More importantly, a main pole with uniaxially compressive stress perpendicular to ABS (σy) throughout the main pole helps the alignment of the easy axis parallel to ABS for CoFe that has a positive magnetostriction. Such magnetic configuration is known to help in easing pole erasure.

Figure 7:
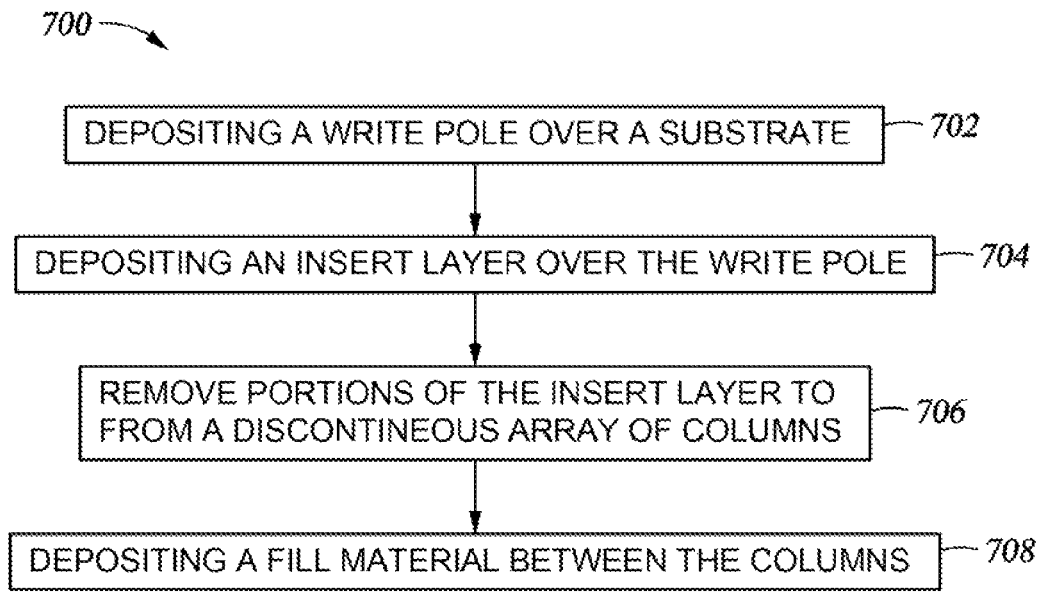
FIG. 7 is a flow diagram of a method for forming a magnetic head according to one embodiment of the invention.

FIG. 7 is a flow diagram of a method 700 for forming a magnetic head according to one embodiment of the invention.

The method 700 starts at step 702 with depositing an insulating layer over a substrate. The substrate may be composed of a non-magnetic material and may include one or more components of a magnetic head, such as a read sensor, shield, heaters, coils etc. The insulating layer may be composed of a non-magnetic material such as $Al_2O_3$ and may be deposited by any suitable deposition method such as chemical vapor deposition (CVD), atomic layer deposition (ALD) or physical vapor deposition (PVD). Only steps relevant to the making of the insert are shown.

Next, at step 704, an insert layer is deposited over the insulating layer. The insert layer may be composed of a stiff material with low CTE such as SiC or W and may be deposited by any suitable deposition method such as CVD or PVD. At step 706, portions of the insert layer are removed by photolithography methods known to those skilled in the art, forming a discontinuous array of columns over the insulating layer. The removal process may be any suitable removal process, such as reactive ion etching (RIE). Last, at step 708, a fill material is deposited between the columns. The fill material may be composed of a non-magnetic material such as $Al_2O_3$ and may be deposited by any suitable deposition method such as CVD, PVD, ionized PVD, ion beam deposition (IBD), atomic layer deposition (ALD), or any available deposition technology designed to fill high aspect ratio vias. The pitch of these discrete columns is dictated by the ability of the deposition technology to fill in the cavities between columns with no defect, and is investment-driven rather than technology-advancement driven. As a process module, process method 700 can be readily inserted into the process flow at appropriate locations where insert is functionally desired.

In summary, a magnetic head having a discontinuous array of columns is disclosed. The columns may be disposed above or below a write pole. The columns may be composed of a stiff material having low CTE for the management of PTR, and the discontinued width at the ABS may help reducing compressive stress that may cause pole erasure.

While the foregoing is directed to embodiments of the present invention, other and further embodiments of the invention may be devised without departing from the basic scope thereof, and the scope thereof is determined by the claims that follow.

What is claimed is:

1. A magnetic head, comprising:
   a write pole extending to an air bearing surface;
   a discontinuous array of columns aligned in a cross-track direction and disposed over the write pole, wherein each of the columns has a length extending perpendicular to the air bearing surface and a width, and wherein the length is greater than the width;
   a non-magnetic layer disposed on the write pole;
   a magnetic shield disposed on the non-magnetic layer; and
   a return pole disposed on the magnetic shield, wherein the discontinuous array of columns are disposed on the return pole.

2. The magnetic head of claim 1, wherein each of the columns comprises a material selected from the group consisting of silicon carbide, tungsten and combinations thereof.

3. The magnetic head of claim 1, wherein each of the columns has a thickness that is less than the length, and wherein the thickness and the width form a surface recessed from the air bearing surface.

4. The magnetic head of claim 3, wherein the non-magnetic layer comprises alumina.

5. The magnetic head of claim 1, wherein the non-magnetic layer comprises alumina.

\* \* \* \* \*